(12) United States Patent
Corisis et al.

(10) Patent No.: US 7,465,607 B2
(45) Date of Patent: Dec. 16, 2008

(54) METHODS OF FABRICATION OF LEAD FRAME-BASED SEMICONDUCTOR DEVICE PACKAGES INCORPORATING AT LEAST ONE LAND GRID ARRAY PACKAGE

(75) Inventors: David J. Corisis, Nampa, ID (US); Chin Hui Chong, Singapore (SG); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/726,283

(22) Filed: Mar. 21, 2007

(65) Prior Publication Data

US 2007/0166880 A1 Jul. 19, 2007

Related U.S. Application Data

(62) Division of application No. 11/212,440, filed on Aug. 25, 2005, now Pat. No. 7,291,900.

(51) Int. Cl.
  *H01L 21/44* (2006.01)
  *H01L 21/48* (2006.01)
  *H01L 21/50* (2006.01)

(52) U.S. Cl. ............... 438/106; 438/123; 257/E21.499; 257/E21.502; 257/E21.503

(58) Field of Classification Search ................. 438/106, 438/107, 108, 111, 118, 123, 124, 125, 126, 438/127
  See application file for complete search history.

(56) References Cited

U.S. PATENT DOCUMENTS

| | | | |
|---|---|---|---|
| 5,258,648 A | * | 11/1993 | Lin ............................. 257/778 |
| 5,461,255 A | | 10/1995 | Chan et al. |
| 5,681,777 A | | 10/1997 | Lynch et al. |
| 5,751,057 A | | 5/1998 | Palagonia |
| 5,790,384 A | | 8/1998 | Ahmad et al. |
| 5,955,777 A | | 9/1999 | Corisis et al. |
| 5,973,928 A | | 10/1999 | Blasi et al. |
| 6,097,098 A | | 8/2000 | Ball |
| 6,255,729 B1 | | 7/2001 | Oikawa |
| 6,630,372 B2 | | 10/2003 | Ball |

(Continued)

OTHER PUBLICATIONS

International Search Report dated Dec. 10, 2007, for International Application No. PCT/US2007/030669 (3 pages).

(Continued)

*Primary Examiner*—David Nhu
(74) *Attorney, Agent, or Firm*—TraskBritt

(57) ABSTRACT

Methods of fabrication of lead frame-based semiconductor device packages including at least one land grid array package. At least one semiconductor die is mounted to an interposer substrate, with bond pads of the semiconductor die connected to terminal pads of the interposer substrate. The terminal pads of the interposer substrate may be electrically connected to both a peripheral array pattern of lands and to a central, two-dimensional array pattern of pads, both array patterns located on an opposing side of the interposer substrate from the at least one semiconductor die. The at least one semiconductor die is overmolded with an encapsulant, leaving the opposing side of the interposer substrate free of encapsulant. Lead fingers of a lead frame superimposed on the opposing side of the interposer substrate are bonded directly to the land grid array lands.

17 Claims, 7 Drawing Sheets

U.S. PATENT DOCUMENTS

| | | |
|---|---|---|
| 6,706,557 B2 | 3/2004 | Koopmans |
| 6,762,079 B2 | 7/2004 | Vaiyapuri |
| 2003/0234451 A1 | 12/2003 | Razon |
| 2004/0007782 A1 | 1/2004 | Hedler et al. |
| 2005/0133916 A1 | 6/2005 | Karnezos |
| 2005/0139980 A1 | 6/2005 | Burns |
| 2005/0263873 A1 | 12/2005 | Shoji |

OTHER PUBLICATIONS

PCT International Search Report dated Apr. 25, 2008, for International Application No. PCT/US2006/030669 (4 pages).

* cited by examiner

METHODS OF FABRICATION OF LEAD FRAME-BASED SEMICONDUCTOR DEVICE PACKAGES INCORPORATING AT LEAST ONE LAND GRID ARRAY PACKAGE

CROSS-REFERENCE TO RELATED APPLICATION

This application is a divisional of application Serial No. 11/212,440, filed Aug. 25, 2005, now U.S. Patent No. 7,291,900, issued Nov. 6, 2007. The disclosure of the previously referenced U.S. patent application is hereby incorporated by reference in its entirety. Furthermore, a related application Serial No. 11/212,215 was filed the same day as U.S. Patent No. 7,291,900.

FIELD OF THE INVENTION

The present invention relates generally to packaging of semiconductor devices and, more particularly, to lead frame-based semiconductor device packages incorporating at least one land grid array package therein, as well as methods of fabricating such packages.

BACKGROUND OF RELATED ART

Semiconductor dice are becoming ever-smaller in dimension, both from advances in fabrication technology and as so-called "shrinks" of initial semiconductor die designs are developed to increase the number of dice which may be fabricated on a wafer or other bulk semiconductor substrate. As a consequence, it becomes more difficult to employ lead frame-based packaging techniques using, for example, wire bonds to directly connect bond pads of a die to lead fingers of a lead frame due to diminishing size of bond pads as well as decreasing pitch (spacing) between adjacent bond pads, rendering it difficult, if not impossible in some circumstances, to place inner ends of lead fingers of a lead frame in close proximity to bond pads to which they are to be wire bonded. In addition, below a certain minimum bond pad size and pitch, it becomes impossible to position a wire bonding capillary head accurately enough to avoid contact with, and possible damage to, adjacent bond pads.

Further, when bond pads are arranged along a central axis of a semiconductor die, such as is conventional in so-called "leads over chip," or "LOC" packages, one may be faced with a choice between elongating and overcrowding lead fingers to place them in close proximity to the bond pads, or forming overly long wire bonds between the bond pads and remotely placed inner ends of lead fingers and risking potential breakage of the wire bonds or shorting between adjacent wire bonds when the package is being transfer-molded in an encapsulant by so-called "wire bond sweep" initiated by the flow front of the molten encapsulant moving over the active surface of the semiconductor die. The use of overly long wire bonds or extended lead fingers may also degrade signal integrity.

In addition, most conventional, lead frame-based packages do not facilitate high device density in conjunction with high multi-die device yields in terms of utilizing available "real estate" on a printed circuit board or other higher-level packaging.

Therefore, it would be desirable to provide a semiconductor device assembly packaging configuration which would accommodate ever-smaller semiconductor dice and their smaller, more closely pitched bond pads, and which would also facilitate the fabrication of highly reliable multi-die assemblies offering relatively high device densities.

BRIEF SUMMARY OF THE INVENTION

The present invention comprises a lead frame-based semiconductor device package including at least one land grid array package.

In one embodiment, the present invention comprises at least one semiconductor die mounted to an interposer substrate, with wire bonds extending from bond pads of the semiconductor die to terminal pads on the side of the interposer substrate to which the at least one semiconductor die is mounted. The terminal pads of the interposer substrate are electrically connected to a land grid array pattern of pads or lands extending along one or more edges of the interposer substrate and to an optional, two-dimensional (in the X and Y directions), more centrally located array pattern of pads, both pad patterns located on the opposing side of the interposer substrate from the at least one semiconductor die. The at least one semiconductor die and wire bonds are overmolded with an encapsulant, leaving the opposing side of the interposer substrate free of encapsulant, to form a land grid array package also providing a two-dimensional pad array suitable for open/short testing and functional testing of the assembly before the land grid array package is incorporated in a lead frame-based assembly. The latter pad array may also be employed for fabrication of a ball grid array using discrete conductive elements disposed on the pads.

In fabrication of a lead frame-based semiconductor device package according to the present invention, inner ends of lead fingers of a lead frame superimposed on the opposing side of the interposer substrate may be bonded directly to the land grid array pads. Thus, the length of interconnect structures extend from the bond pads of the at least one semiconductor die to the inner ends of the lead fingers is extremely short, enhancing signal integrity. The resulting assembly may, optionally, be encapsulated, outer ends of the lead fingers extending beyond the envelope of the encapsulant body. A conventional trim and form operation may be used to remove the lead frame surrounding the lead fingers as well as tie bars or dam bars extending therebetween, and form the outer ends of the lead fingers to final shape and length. A resulting semiconductor device package of the present invention exhibiting a high degree of integrity may thus be fabricated to mimic the total height of a conventional, compact semiconductor package such as a thin small outline package (TSOP).

In another embodiment, two land grid array packages as previously described are superimposed on opposing sides of, and directly bonded to, lead fingers of a lead frame disposed therebetween. In this embodiment, the pinouts of the land grid array of each package are configured as mirror images of one another.

In yet another embodiment, two land grid array packages as previously described are, again, superimposed on opposing sides of a lead frame disposed therebetween. However, in this embodiment, only one of the land grid array packages has its land grid array pads bonded to lead fingers of the lead frame, the other land grid array package being mechanically and electrically connected directly to the one land grid array package by discrete conductive elements extending between the pads of their respective, two-dimensional, superimposed pad arrays, wherein the pinouts of each such array are mutually configured as mirror images on one another. A dielectric underfill may be disposed between the two land grid array packages, around the discrete conductive elements and between the lead fingers.

In still another variant, a semiconductor die with a central row or rows of bond pads may be mounted by its active surface to an interposer substrate having a slot therethrough in board-on-chip (BOC) fashion, the bond pads being exposed through the slot and connected, as by wire bonds, to terminal pads on the interposer substrate flanking the slot. The terminal pads, in turn, are electrically connected to lands proximate and extending along at least one peripheral edge of the interposer substrate through conductive traces. If used, a segmented array of pads electrically connected to the terminal pads may be disposed in two groups on opposing sides of the central slot outboard of the terminal pads. The resulting land grid array package may be connected to a lead frame.

Methods of fabricating lead frame-based semiconductor device packages including at least one land grid array package are also encompassed by the present invention, as are land grid array packages suitable for use in the semiconductor device assemblies of the present invention.

DETAILED DESCRIPTION OF THE INVENTION

Figure 1:
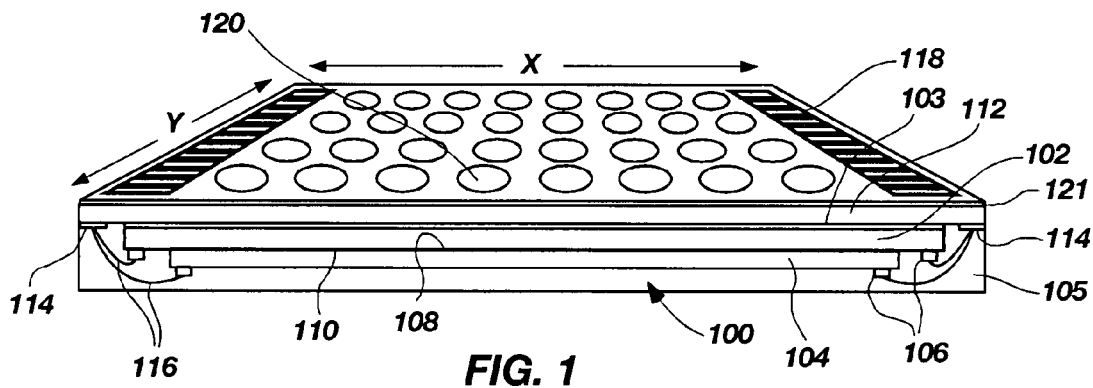
FIG. 1 is a perspective view of one land grid array package configuration according to the present invention with a near side of the package cut away to depict internal components.

In the description which follows, like features and elements have been identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

Referring now to FIG. 1 of the invention, land grid array package 100 comprises first and second semiconductor dice 102 and 104, each of which bears bond pads 106 adjacent opposing peripheral edges thereof, according to a selected pinout design, which may be customized using a redistribution layer to relocated inner lead bond locations to more peripheral, outer lead bond locations of bond pads 106. As can be seen in FIG. 1, semiconductor die 104 is slightly shorter in length than semiconductor die 102, so that as semiconductor die 104 is mounted by its back side 108 to the active surface 110 of semiconductor die 102, bond pads 106 of semiconductor die 102 remain exposed. Semiconductor die 102 is mounted by its back side 108 to interposer substrate 112, the bond pads of each semiconductor die 102 and 104 being electrically connected to terminal pads 114 disposed in rows along opposing edges of interposer substrate 112 by wire bonds 116 extending therebetween. The side of interposer substrate 112 bearing semiconductor dice 102 and 104 is encapsulated in an encapsulant structure of dielectric material 105 covering the semiconductor dice 102 and 104, wire bonds 116 and terminal pads 114. Desirably, the encapsulant structure extends to the lateral periphery of interposer substrate 112. Encapsulation may be effected by conventional techniques such as, by way of example only, transfer molding, injection molding and pot molding.

Each terminal pad 114 is electrically connected through a conductive via to an associated conductive land 118 in a row of lands 118 extending along the same edge, but on an opposing side, of interposer substrate 112. Each terminal pad 114 may also be optionally electrically connected through a via (which may be the same or a different via) and a conductive trace to a conductive pad 120 of an array of pads 120 located in a central region of interposer substrate 112 between the rows of lands 118 and on the same side of interposer substrate 112 thereas. Thus, semiconductor dice 102 and 104 may be electrically accessed through contact with pads 120 or through lands 118. Pads 120 may be used for open/short testing and functional testing of the semiconductor dice 102 and 104 of land grid array package 100 prior to final assembly with other components or for other purposes as described below. The pinouts of the lands 118 as well as the pads 120 may, of course, be customized for, respectively, connection to a lead frame as further described below as well as for testing. The dimensions and pinouts of land grid array package 100 may be selected for compatibility with all Flash and random access (RAM) memory semiconductor devices.

Figure 2:
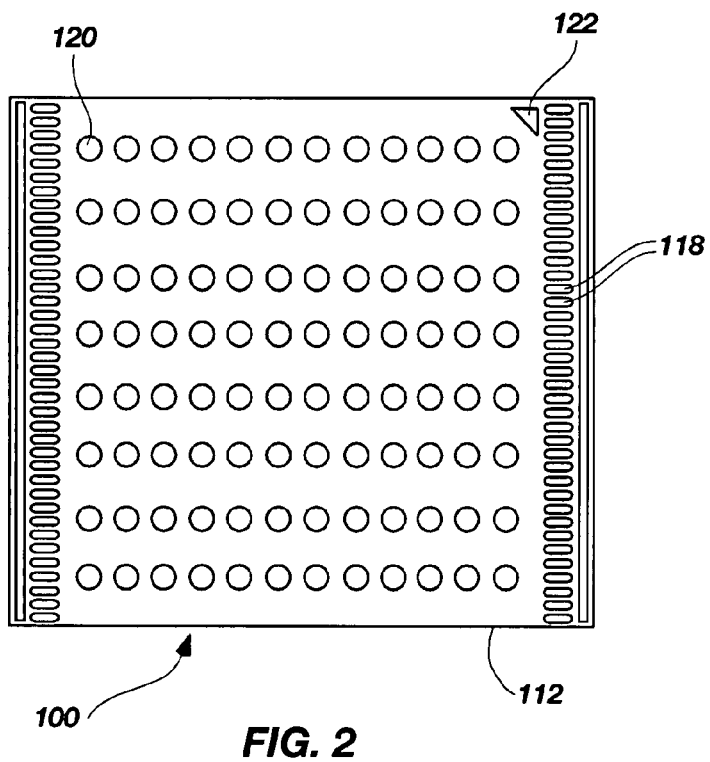
FIG. 2 is a top elevation of the land grid array package of FIG. 1.
Figure 2A:
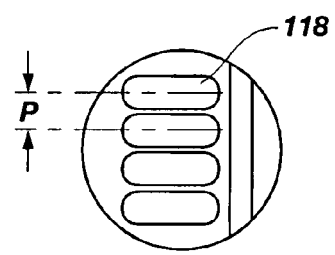
FIG. 2A is an enlarged view of a portion of FIG. 2 near a periphery thereof.

Referring now to FIG. 2, the configuration of the central, two-dimensional array of pads 120 may be clearly seen, pads 120 being exposed, for example, through 0.300 mm openings in a solder mask on interposer substrate 112. As shown, the location, or identification of Pin A1 of the pinout pattern of lands 118 may be identified by a fiducial mark 122 at a corner of interposer substrate 112 immediately inboard of a row of lands 118. Such a fiducial mark 122 is useful for both operator and machine vision recognition and proper orientation and placement of land grid array package 100 for testing as well as assembly purposes. FIG. 2A depicts the configuration and pitch (spacing) P of lands 118, which are matched to the width and pitch of lead fingers of a lead frame to be assembled with land grid array package 100 as described below.

Figure 3:
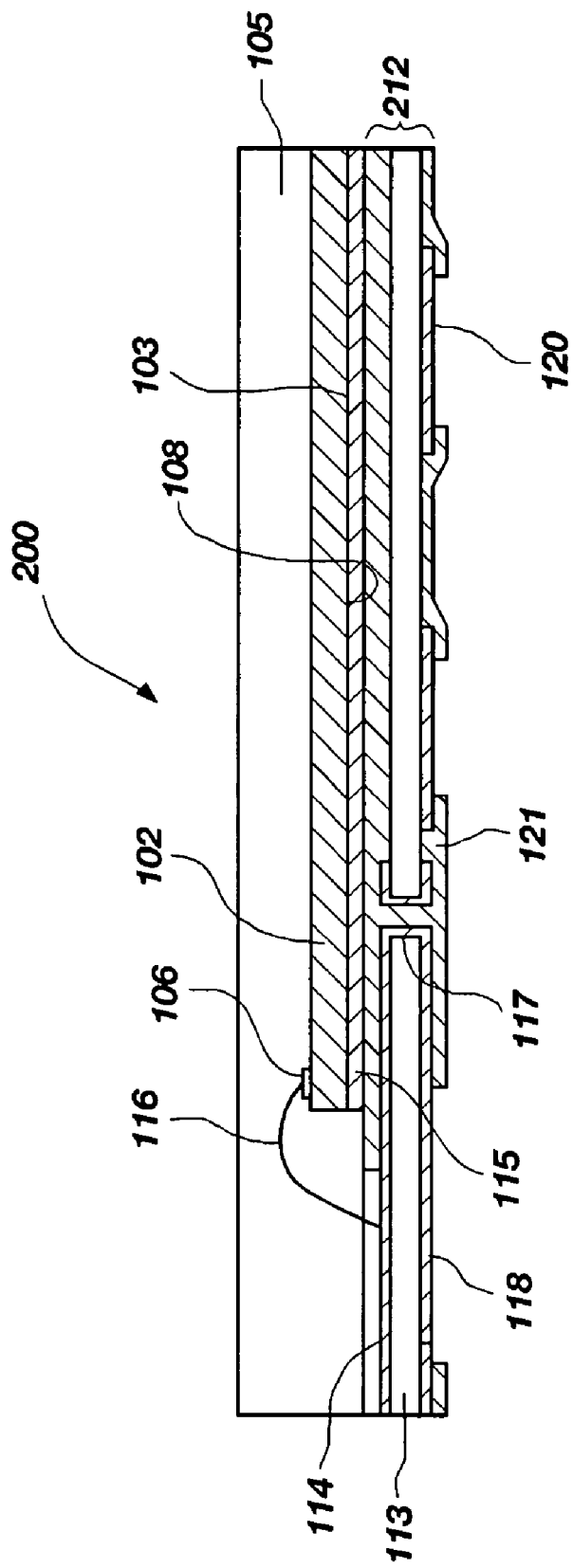
FIG. 3 is an enlarged, side sectional elevation of a portion of another land grid array package configuration according to the present invention.

FIG. 3 is an enlarged, side sectional view of a portion of another embodiment of a land grid array package 200 according to the present invention. Land grid array package 200 includes only a single semiconductor die 102 with bond pads 106 along opposing peripheral edges thereof. Semiconductor die 102 is mounted by its back side 108 to interposer substrate 212 by an adhesive element or layer 103, with wire bonds 116 extending between and electrically connecting bond pads 106 with terminal pads 114 of interposer substrate 212.

Interposer substrate 212, as with interposer substrate 112, includes a dielectric core or member 113 which carries conductive material thereon comprising terminal pads 114, conductive traces 115, lands 118 and pads 120, terminal pads 114 being electrically connected to lands 118 and pads 120 by conductive traces 115 and conductively lined or filled via structures 117. Dielectric core 113 may comprise any suitable electrically insulative material such as, by way of example only, a polyimide film or sheet, BT resin, FR-4 or FR-5 laminate, or a ceramic, and terminal pads 114, conductive traces 115, conductively lined or filled via structures 117, lands 118 and pads 120 may be formed of any suitable conductive material such as, by way of example only, copper or aluminum. These conductive structures may be formed by conventional blanket deposition of the conductive material on dielectric core 113 and into via structures 117, followed by conventional application of a photoresist, masking, exposing and developing to define the conductive structures on each side of dielectric core 113, and etching away portions of the conductive material exposed by the photoresist pattern. Alternatively, interposer substrates 112 and 212 may be provided as a dielectric core 113 sandwiched between two conductive sheets, via structures 117 formed therethrough and conductively lined or filled, and then the conductive structures formed on the major surfaces thereof by conventional masking and etching. As may be easily seen in FIG. 3, a solder mask or other patterned dielectric layer 121 may be employed to cover both sides of interposer substrate 212 (as well as interposer substrate 112 of FIG. 1) to fill conductively lined (if not completely conductively filled) via structures 117, and leave terminal pads 114, lands 118 and pads 120 exposed.

In a variant of the configuration of FIG. 3, it is contemplated that a semiconductor die 102 with a central, axial row or rows of bond pads 106 may be attached by an active surface 110 hereof to an interposer substrate 212 having a slot therethrough (not shown) to expose the bond pads 106. The bond pads 106 may be connected by wire bonds 116 to terminal pads 114 flanking the slot on the opposing side of the interposer substrate 212 in the manner of a board-on-chip (BOC) assembly, the terminal pads 114 being electrically connected by conductive traces to lands along one or more peripheral edges of the interposer substrate 212 on the opposing side of the interposer substrate 212 and (optionally) to an array of pads 120 on the opposing side of the interposer substrate 212 segmented into two groups on both sides of the slot. The back side 108 and sides of the semiconductor die 102, as well as the bond pads 106, wire bonds 116 and terminal pads 114, may be encapsulated with a dielectric material 105, such as by transfer molding, injection molding, pot molding, etc. This approach eliminates the need for vias extending through the interposer substrate 212. The resulting land grid array package may then be connected to a lead frame as described below with reference to FIGS. 4 through 9.

Land grid array packages 100, 200 may then be open/short tested as well as functionally tested using pads 120 before further assembly with a lead frame.

Figure 4:
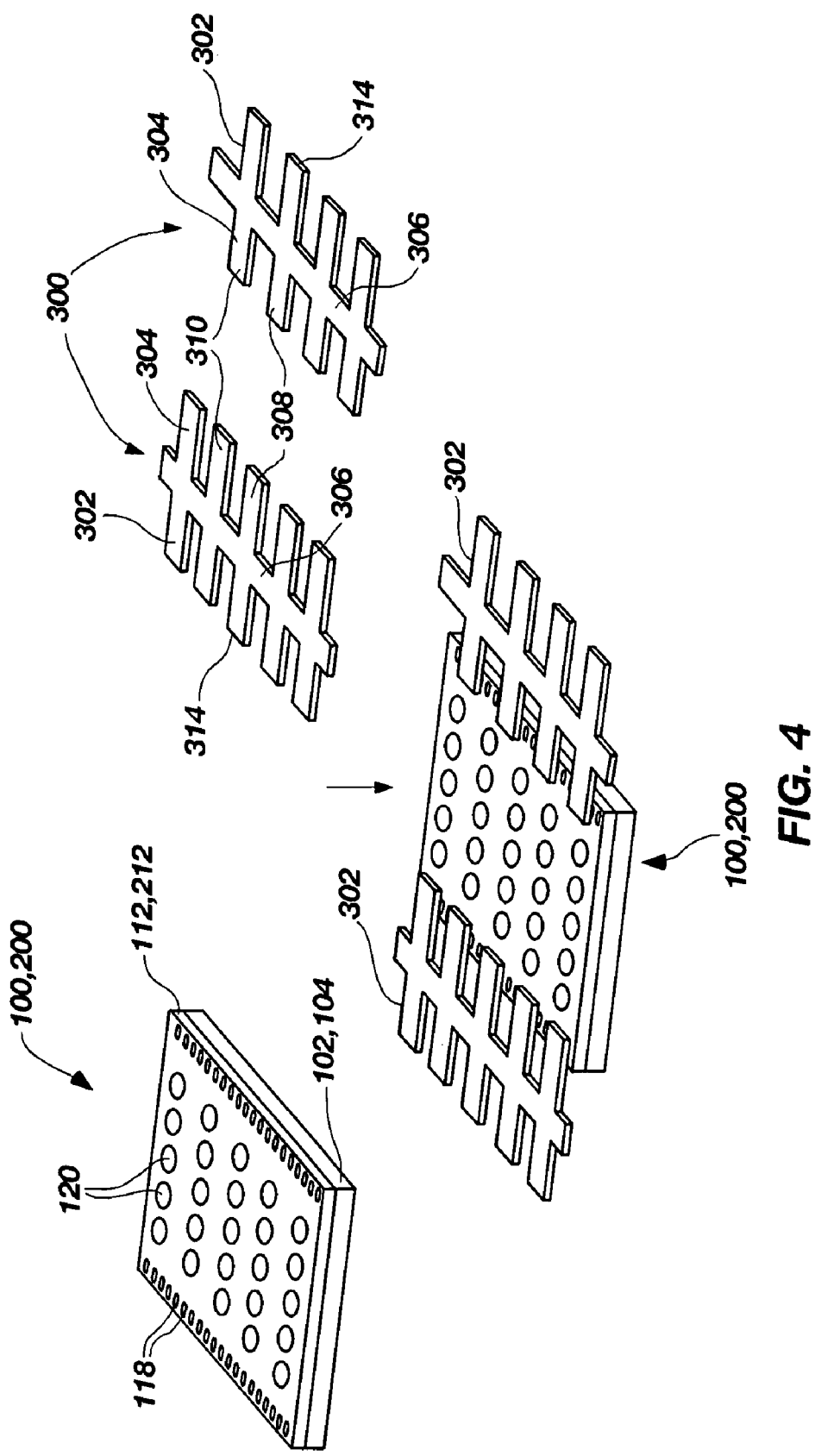
FIG. 4 is a perspective view of a land grid array package according to the present invention prior to, and after, assembly with a lead frame.

As depicted in FIG. 4, a land grid array package 100, 200 (shown in an inverted position as depicted in more detail in FIG. 1) may then be aligned with a lead frame 300 comprising two opposing lead frame segments 302 each including a plurality of lead fingers 304 separated by transversely extending segments 306, which as illustrated comprise tie bars integrally formed with lead fingers 304. Inner ends 308 of lead fingers 304 are placed over lands 118, and mechanically and electrically connected thereto by solder 310, which may be preplaced in a paste form, as by stenciling, on lands 118 or on inner ends 308, lands 118 being formed or coated with a solder-wettable material. The solder 310 is reflowed to bond inner ends 308 to lands 118 by application of heat. Rather than soldering, lands 118 may be mechanically and electrically connected to inner ends 308 of lead fingers 304 using a conductive or conductor-filled epoxy, which may be cured to a B-stage (tacky) prior to assembly of the components and then further cured to form a solid, permanent bond.

Figure 5:
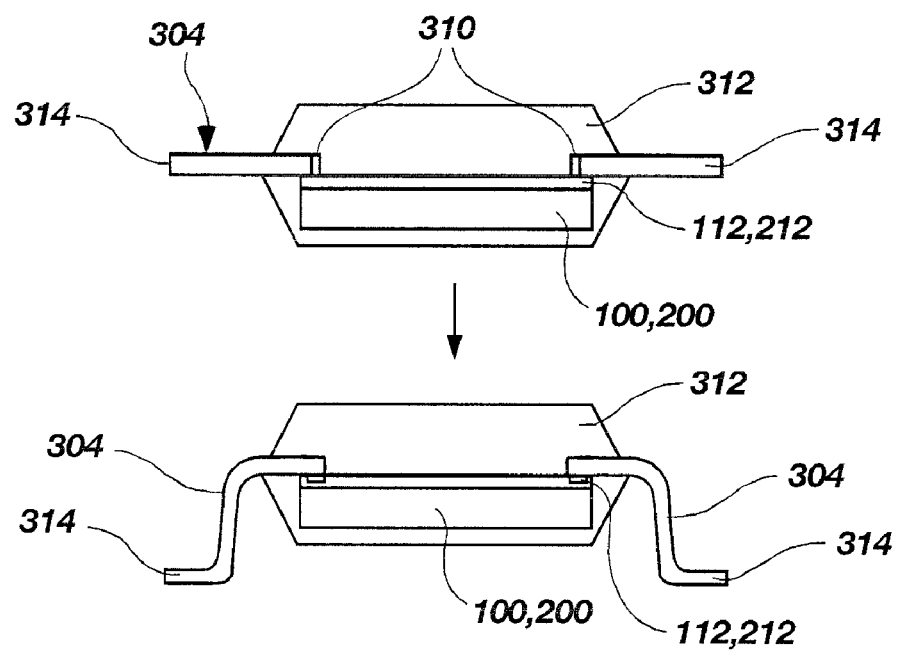
FIG. 5 is a schematic view of an encapsulated embodiment of a land grid array package assembled with a lead frame according to the present invention before and after a trim and form operation.

The resulting assembly may then be encapsulated, as shown in FIG. 5, with a dielectric material 312 such as a silicon-filled thermoplastic resin applied, for example, by transfer molding (although other conventional techniques may also be suitable), so that land grid array package 100, 200 is itself completely encapsulated as are the inner ends 308 of lead fingers 304 and pads 120 by a layer of the dielectric material 312 extending over the entire surface of land grid array package 100, 200 facing lead frame 300. Outer ends 314 of lead fingers 304 extend beyond the dielectric material 312, to be used for connection to external circuitry. The lead fingers 304 may then be formed into a final configuration and transversely extending segments 306 removed in a conventional trim and form operation, as shown.

Figure 6:
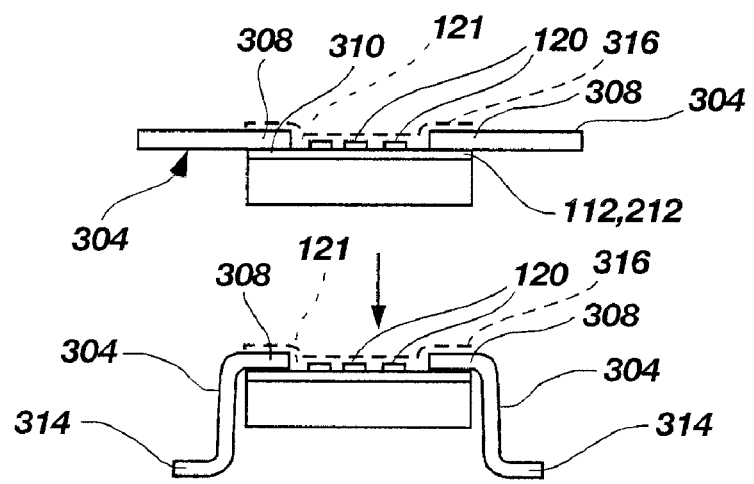
FIG. 6 is a schematic view of an unencapsulated embodiment of a land grid array package assembled with a lead frame according to the present invention before and after a trim and form operation.

In another approach, shown in FIG. 6, the assembly of lead frame 300 with land grid array package 100, 200 may remain unencapsulated, and a thin layer of dielectric material 316 applied as shown in broken lines to cover pads 120 and, optionally, inner ends 308 of lead fingers 304. Such a layer may comprise, for example, a polymer coating such as a polyimide, applied by a dispensing nozzle or spray head or an adhesive-coated dielectric film. A photopolymer may also be employed, applied by commercially available equipment and exposed to an appropriate wavelength of light (typically UV) to cure the photopolymer after or as it is applied. As with the embodiment of FIG. 5, lead fingers 304 may then be formed into a final configuration and transversely extending segments 306 removed in a conventional trim and form operation, as shown.

In yet another variant of the approach depicted in FIG. 6, ground or power leads, for example, may be connected in the central region of land grid array package 100, 200 superimposed over, but electrically insulated from, pads 120 to form a paddle-type structure suitable for laser marking the part. As a further option, pads 120 may be omitted if not desired or required, as previously noted herein.

Figure 7:
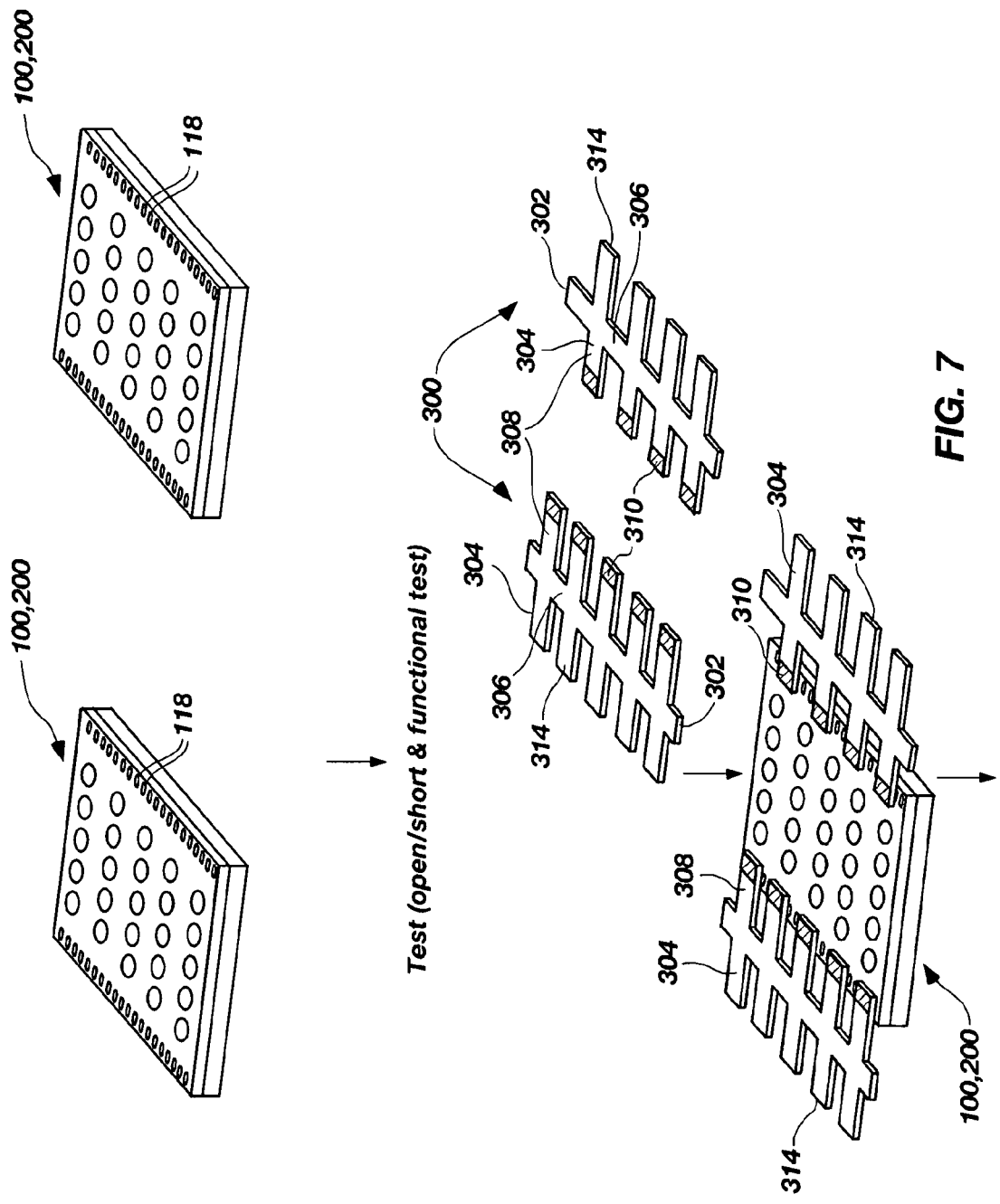
FIG. 7 is a perspective view of two land grid array packages according to another embodiment of the invention prior to assembly with a lead frame and after one of the land grid array packages has been assembled therewith.

FIG. 7 depicts another embodiment of the present invention wherein two land grid array packages, such as 100, 200, may be electrically connected to opposing sides of a common lead frame 300. In this embodiment, each land grid array package has a common, but mutually mirror-imaged, pinout pattern for lands 118. The two land grid array packages 100, 200 may be of the same size and shape, or may differ in size and shape as long as the array of lands 118 carried by each package is located and pitched for attachment to opposing sides of lead fingers 304 of a lead frame 300. As noted previously, prior to assembly with lead frame 300, land grid array packages 100, 200 may be open/short tested or functionally tested using pads 120.

Figure 8:
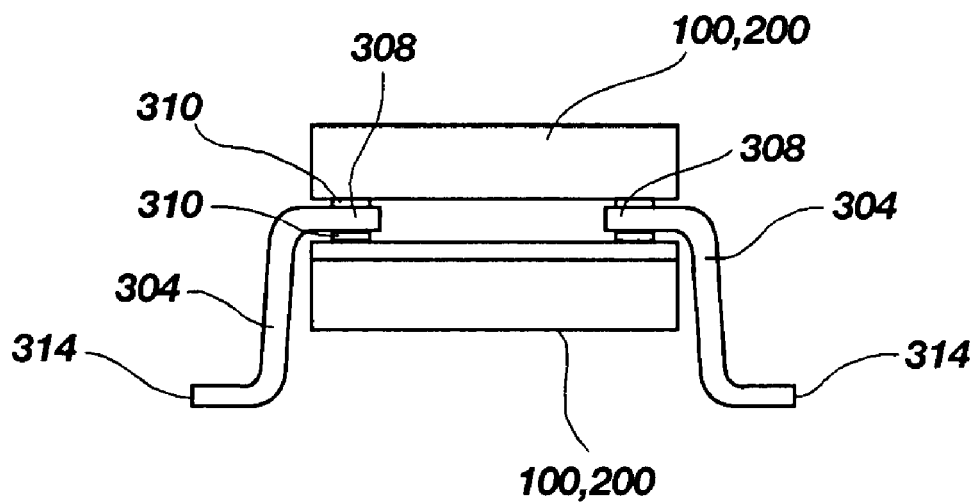
FIG. 8 is a schematic side elevation of one variation of the embodiment of FIG. 7 wherein the two land grid array packages are each directly connected to opposing sides of the lead frame disposed therebetween.

As shown in FIGS. 7 and 8, lands 118 of one land grid array package 100, 200 may be soldered to one side of inner ends 308 of lead fingers 304 as previously described with respect to FIG. 5. Then, as shown in FIG. 8, the other land grid array package 100, 200 may be superimposed on the opposing side of the lead frame 300 and inner ends 308 soldered to lands 118 of the second land grid array package 100, 200. Alternatively, both land grid array packages 100, 200 may be aligned with lead frame 300 and alignment of the three components maintained by a clamp or other fixture, and both land grid array packages 100, 200 bonded to lead frame 300 substantially simultaneously. As noted above, techniques other than soldering may also be used. A conventional trim and form operation may be performed to configure lead fingers 304 to their final form and to remove transversely extending segments 306, as shown.

Figure 9:
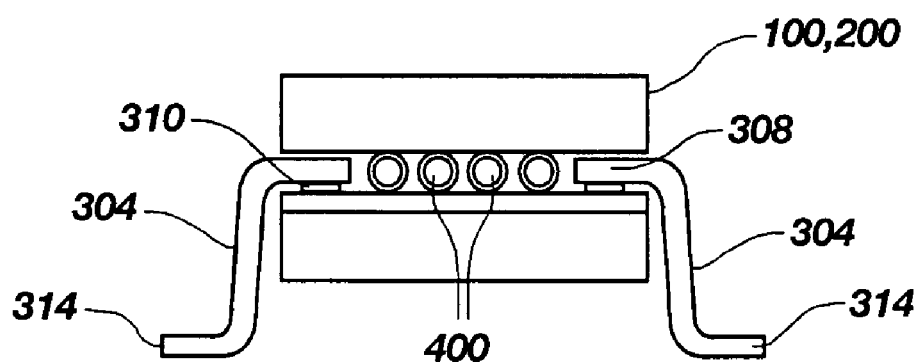
FIG. 9 is a schematic side elevation of one variation of the embodiment of FIG. 7 wherein one of the two land grid array packages is directly connected to the lead frame disposed between the two land grid array packages and a terminal array of the other land grid array package is connected to a terminal array of the first land grid array package using an array of discrete conductive elements.

As shown in FIG. 9, rather than connecting lead frame 300 to both land grid array packages 100, 200, one land grid array package may be directly connected thereto as depicted in FIG. 7 and the other land grid array package 100, 200 connected to the first land grid array package 100, 200 by discrete conductive elements 400 extending between the mutually superimposed and aligned pads 120 of each package. Discrete conductive elements 400 may comprise solder balls, conductive or conductor-filled epoxy elements, or other conductive studs, bumps, columns or pillars as known and employed in the art. In this instance, the two-dimensional, central pad array of each land grid array package 100, 200 will be a mirror image of the opposing package and the package not directly connected to lead frame 300 need not have lands 118 formed on the interposer substrate thereof. A dielectric underfill material may be introduced between the one and the other land grid array packages 100, 200 and about the discrete conductive elements 400. A conventional trim and form operation may be performed to configure lead fingers 304 to their final form and to remove transversely extending segments 306, as shown.

Figure 10:
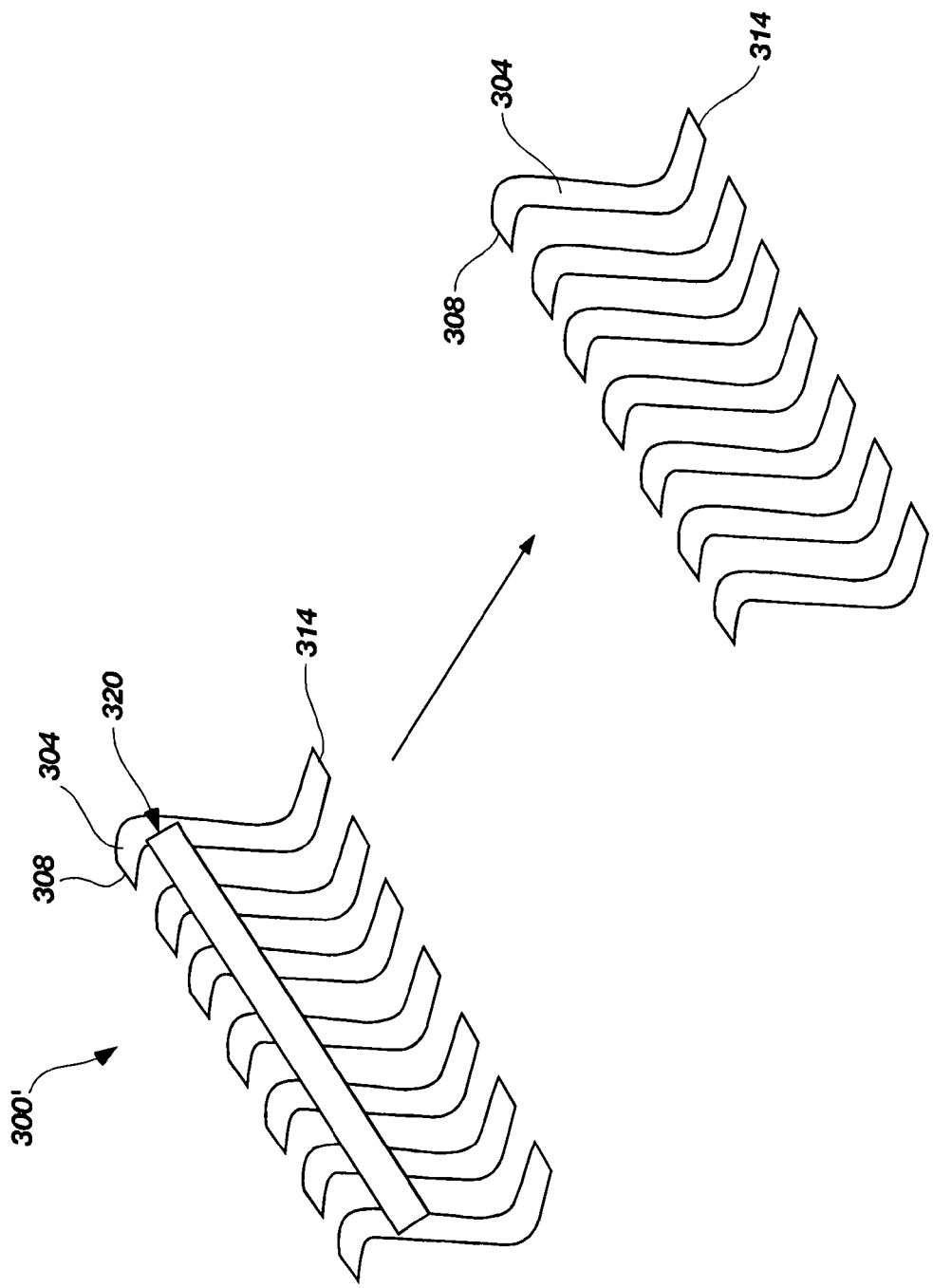
FIG. 10 is a schematic representation of a lead frame, before and after removal of elements laterally connecting and separating lead fingers thereof

FIG. 10 depicts an alternative lead frame configuration 300' wherein lead fingers 304 are individually formed and then configured into a lead frame by use of a transversely extending, elongated tape segment 320 extending thereacross. Tape segment 320 may comprise, for example, a KAPTON® polymer, coated on one side thereof by a heat-sensitive adhesive. After assembly of a lead frame 300' with one or more land grid array packages 100, 200 and optional encapsulation, lead fingers 304 may be formed to their final configuration and heat applied to tape segment 320 to cause the adhesive to release, permitting easy removal of tape segment 320. Alternatively, lead fingers 304 may be preformed to their final shape prior to application of elongated tape segment thereto.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims which follow.

What is claimed is:

1. A method of fabricating a semiconductor device package, the method comprising:
   providing an interposer substrate comprising a dielectric member, a plurality of terminals proximate and extending along at least one peripheral edge thereof on one side thereof and an array of lands proximate and extending along a same at least one peripheral edge on an opposing side of the interposer substrate, terminals of the plurality of terminals being respectively electrically connected to lands of the array of lands through conductive via structures extending through the dielectric member;
   mounting at least one semiconductor die by a back side thereof to the one side of the interposer substrate with a plurality of bond pads on an active surface thereof proximate and extending along at least one peripheral edge thereof adjacent the at least one peripheral edge of the interposer substrate;
   respectively electrically connecting the plurality of bond pads to the plurality of terminals;
   disposing an encapsulant structure over the at least one semiconductor die and the one side of the interposer substrate; and
   disposing a lead frame comprising a plurality of lead fingers having inner ends respectively over lands of the array of lands on the opposing side of the interposer substrate and mechanically and electrically connecting the inner ends to lands of the array of lands.

2. The method of fabricating a semiconductor device package of claim 1, further comprising selecting the at least one peripheral edge of each of the interposer substrate and the at least one semiconductor die to comprise two opposing peripheral edges.

3. The method of fabricating a semiconductor device package of claim 1, further comprising electrically connecting the plurality of bond pads to the plurality of terminals with wire bonds.

4. The method of fabricating a semiconductor device package of claim 1, further comprising:
   selecting the at least one semiconductor die to comprise two semiconductor dice;
   mounting one semiconductor die by a back side thereof on the interposer substrate;
   mounting another semiconductor die by a back side thereof on the active surface of the one semiconductor die in a manner to leave the plurality of bond pads of the one semiconductor die exposed.

5. The method of fabricating a semiconductor device package of claim 4, further comprising electrically connecting the plurality of bond pads of each of the one semiconductor die and the another semiconductor die to the plurality of terminals with wire bonds.

6. The method of fabricating a semiconductor device package of claim 1, further comprising providing the interposer substrate with a two-dimensional array of pads substantially centrally located on the opposing side thereof, wherein terminals of the plurality are respectively electrically connected to pads of the two-dimensional array of pads through the conductive via structures extending through the dielectric member.

7. The method of fabricating a semiconductor device package of claim 1, further comprising forming the encapsulant structure to extend to peripheral edges of the interposer substrate.

8. The method of fabricating a semiconductor device package of claim 1, further comprising mechanically and electrically connecting the inner ends of the plurality of lead fingers to the lands with a conductive bonding material.

9. The method of fabricating a semiconductor device package of claim 8, further comprising selecting the conductive bonding material to comprise a solder.

10. The method of fabricating a semiconductor device package of claim 1, further comprising overmolding the inner ends of the plurality of lead fingers, the opposing side and periphery of the interposer substrate and exposed exterior surfaces of the encapsulant structure with a dielectric material.

11. The method of fabricating a semiconductor device package of claim 1, further comprising covering the inner ends of the plurality of lead fingers and the opposing side of the interposer substrate with a dielectric material.

12. The method of fabricating a semiconductor device package of claim 1, further comprising:

providing another interposer substrate comprising a dielectric member, a plurality of terminals proximate and extending along at least one peripheral edge thereof on one side thereof and an array of lands proximate and extending along a same at least one peripheral edge on an opposing side of the another interposer substrate, terminals of the plurality of terminals being respectively electrically connected to lands of the array of lands through conductive via structures extending through the dielectric member;

selecting a pinout pattern of the array of lands of the another interposer substrate and a pinout pattern of the array of lands of the interposer substrate to be mirror images of one another;

mounting at least one semiconductor die by a back side thereof to the one side of the another interposer substrate with a plurality of bond pads on an active surface thereof proximate and extending along at least one peripheral edge thereof adjacent the at least one peripheral edge of the another interposer substrate;

respectively electrically connecting the plurality of bond pads to the plurality of terminals;

disposing an encapsulant structure over the at least one semiconductor die and the one side of the another interposer substrate; and disposing lands of the array of lands of the another interposer substrate respectively over the inner ends of the plurality of lead fingers of the lead frame on an opposing side thereof from the lands of the array of lands of the interposer substrate and mechanically and electrically connecting lands of the array of lands of the another interposer substrate to the inner ends of the plurality of lead fingers.

13. The method of fabricating a semiconductor device package of claim 6, further comprising:

providing another interposer substrate comprising a dielectric member, a plurality of terminals proximate and extending along at least one peripheral edge thereof on one side thereof and a two-dimensional array of pads substantially centrally located on the opposing side of the another interposer substrate, and wherein terminals of the plurality are respectively electrically connected to pads of the two-dimensional array of pads through conductive via structures extending through the dielectric member;

selecting a pinout pattern of the two-dimensional array of pads of the another interposer substrate and a pinout pattern of the two-dimensional array of pads of the interposer substrate to be mirror images of one another;

mounting at least one other semiconductor die by a back side thereof to the one side of the another interposer substrate with a plurality of bond pads on an active surface thereof proximate and extending along at least one peripheral edge thereof adjacent the at least one peripheral edge of the another interposer substrate;

respectively electrically connecting the plurality of bond pads to the plurality of terminals;

disposing an encapsulant structure over the at least one other semiconductor die and the one side of the another interposer substrate; and mechanically and electrically connecting pads of the two-dimensional array of pads of the another interposer substrate to pads of the two-dimensional array of pads of the interposer substrate by discrete conductive elements disposed and bonded therebetween.

14. The method of fabricating a semiconductor device package of claim 13, further comprising selecting the discrete conductive elements to comprise solder balls.

15. The method of fabricating a semiconductor device package of claim 14, further comprising disposing a dielectric underfill material between the interposer substrate and the another interposer substrate and around the discrete conductive elements.

16. The method of fabricating a semiconductor device package of claim 1, further comprising testing the at least one semiconductor die after mounting to the interposer substrate and connection of the plurality of bond pads to the plurality of terminals and before disposing the inner ends of the plurality of lead fingers over the lands of the array of lands.

17. The method of fabricating a semiconductor device package of claim 16, wherein testing comprises at least one of open/short testing and functional testing.

* * * * *